(12) United States Patent
Au et al.

(10) Patent No.: US 6,235,586 B1
(45) Date of Patent: May 22, 2001

(54) THIN FLOATING GATE AND CONDUCTIVE SELECT GATE IN SITU DOPED AMORPHOUS SILICON MATERIAL FOR NAND TYPE FLASH MEMORY DEVICE APPLICATIONS

(75) Inventors: Kenneth Wo-Wai Au, Fremont; Kent Kuohua Chang; Hao Fang, both of Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/352,801

(22) Filed: Jul. 13, 1999

(51) Int. Cl.$^7$ ................................................. H01L 21/8247
(52) U.S. Cl. .......................... 438/258; 438/264; 438/594
(58) Field of Search .................................... 438/257–267, 438/593–599

(56) References Cited

U.S. PATENT DOCUMENTS

| | | |
|---|---|---|
| 5,424,232 | 6/1995 | Yamauchi . |
| 5,471,070 | 11/1995 | Shimada et al. ........................ 257/57 |
| 5,493,140 | 2/1996 | Iguchi ................................... 257/316 |
| 5,511,020 | 4/1996 | Hu et al. . |
| 5,597,749 | 1/1997 | Iguchi ..................................... 437/43 |
| 5,637,520 * | 6/1997 | Cappelletti et al. ................. 438/258 |
| 5,643,633 | 7/1997 | Telford et al. ........................ 427/255 |
| 5,661,053 | 8/1997 | Yuan ...................................... 437/43 |
| 5,668,034 | 9/1997 | Sery et al. ............................ 438/266 |
| 5,824,583 * | 10/1998 | Asano et al. .......................... 438/258 |
| 5,830,794 * | 11/1998 | Kusunoki et al. .................... 438/266 |
| 5,891,794 * | 4/1999 | Ibok ...................................... 438/592 |
| 5,910,016 * | 6/1999 | Kazerounian et al. .............. 438/258 |
| 5,981,340 * | 11/1999 | Chang et al. ......................... 438/258 |
| 6,023,085 * | 2/2000 | Fang ..................................... 257/315 |

FOREIGN PATENT DOCUMENTS 612108A  8/1994  (EP) .
663695A  7/1995  (EP) .

* cited by examiner

*Primary Examiner*—Richard Booth
(74) *Attorney, Agent, or Firm*—Renner, Otto, Boisselle & Sklar, LLP

(57) ABSTRACT

In one embodiment, the present invention relates to a method of forming a NAND type flash memory device, involving the steps of growing a first oxide layer over at least a portion of a substrate, the substrate including a flash memory cell area and a select gate area; removing a portion of the first oxide layer in the flash memory cell area of the substrate; growing a second oxide layer over at least a portion of the substrate in the flash memory cell area and over at least a portion of the a first oxide layer in the select gate area; depositing a first in situ doped amorphous silicon layer over at least a portion of the second oxide layer, the first in situ doped amorphous silicon layer having a thickness from about 400 Å to about 1,000 Å; depositing a dielectric layer over at least a portion of the first in situ doped amorphous silicon layer; depositing a second doped amorphous silicon layer over at least a portion of the dielectric layer; and forming a flash memory cell in the flash memory cell area of the substrate and a select gate transistor in the select gate area substrate, the flash memory cell comprising the second oxide layer, the first in situ doped amorphous silicon layer, the dielectric layer, and the second doped amorphous silicon layer, and the select gate transistor comprising the first oxide layer, second oxide layer, the first in situ doped amorphous silicon layer, the dielectric layer, and the second doped amorphous silicon layer.

20 Claims, 4 Drawing Sheets

THIN FLOATING GATE AND CONDUCTIVE SELECT GATE IN SITU DOPED AMORPHOUS SILICON MATERIAL FOR NAND TYPE FLASH MEMORY DEVICE APPLICATIONS

TECHNICAL FIELD

The present invention generally relates to improved methods of making flash memory devices such as EEPROMs. More particularly, the present invention relates to methods of making NAND type flash memory devices characterized by improved select gate performance.

BACKGROUND ART

Semiconductor devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 11 are coupled together in a NAND-type circuit configuration, such as, for example, the configuration illustrated in prior art FIG. 1b. Each memory cell 14 has a drain 14a, a source 14b and a stacked gate 14c. A plurality of memory cells 14 connected together in series with a drain select transistor at one end and a source select transistor at the other end to form a NAND string as illustrated in prior art FIG. 1b. Each stacked gate 14c is coupled to a word line (WL0, WL1, . . ., WLn) while each drain of the drain select transistors are coupled to a bit line (BL0, BL1, . . ., BLn). Lastly, each source of the source select transistors are coupled to a common source line Vss. Using peripheral decoder and control circuitry, each memory cell 14 can be addressed for programming, reading or erasing functions.

Prior art FIG. 1c represents a fragmentary cross section diagram of a typical memory cell 14 in the core region 11 of prior art FIGS. 1a and 1b. Such a cell 14 typically includes the source 14b, the drain 14a and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, for example, prior art FIG. 1b). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

The process for making such NAND type flash memory devices includes numerous individual processing steps. There are numerous concerns associated with making flash memory devices that provide consistent performance and reliability. For example, the thicker the floating gate, the more likely undesirable cracking occurs in the tungsten silicide layer and the more likely etch problems occur due to high aspect ratios and high topographies. However, the thicker the floating gate, higher the stress released on the tunnel oxide layer, improved tunnel oxide reliability, improved conductivity and better circuit performance result. The thinner the floating gate, the more likely undesirable punch through during etch occurs, especially the Poly 1 contact etch for the select gate, as well as an undesirable increase in pinhole defects. Further, when the thickness of the Poly 1 is too thin, an HF dip cleaning step (prior to forming the ONO multilayer dielectric film) may degrade the Poly 1 and attack the tunnel oxide.

If the doping level is too low in the floating gate, wordline resistance and contact resistance become undesirably high, and specifically resistivity for the select gate becomes undesirably high. However, low doping results in a smooth tunnel oxide—floating gate interface. Low doping also results in fewer charge gain (loss) problems. If the doping level is too high in the floating gate, undesirable dopant segregation to the tunnel oxide occurs, undermining the tunnel oxide integrity. Undesirably high doping levels lead to severe surface roughness between the floating gate and the tunnel oxide, resulting in high local electric fields, lower oxide dielectric strength, and program/erase endurance cycling problems.

In view of the aforementioned concerns and problems, there is a need for flash memory cells of improved quality and more efficient methods of making such memory cells.

SUMMARY OF THE INVENTION

As a result of the present invention, non-volatile flash memory device fabrication is improved thereby producing devices having improved reliability. By employing the methods of the present invention which provide for specific parameters for making floating gates and select gates, the formation of a flash memory device having a low defect density, minimized charge gain/loss and low conductivity of select gate concerns from high/low Poly 1 doping, and fewer select gate interconnection problems is facilitated. Moreover, the methods of the present invention minimize and/or eliminate undesirable HF attack of tunnel oxide, high local electric fields, tungsten silicide cracking, and pinhole defects.

In one embodiment, the present invention relates to a method of forming a NAND type flash memory device, involving the steps of growing a first oxide layer over at least a portion of a substrate, the substrate including a flash memory cell area and a select gate area; removing a portion of the first oxide layer in the flash memory cell area of the substrate; growing a second oxide layer over at least a portion of the substrate in the flash memory cell area and over at least a portion of the a first oxide layer in the select gate area; depositing a first in situ doped amorphous silicon layer over at least a portion of the second oxide layer, the first in situ doped amorphous silicon layer having a thickness from about 400 Å to about 1,000 Å; depositing a dielectric layer over at least a portion of the first in situ doped amorphous silicon layer; depositing a second doped amorphous silicon layer over at least a portion of the dielectric layer; and forming a flash memory cell in the flash memory cell area of the substrate and a select gate transistor in the select gate area substrate, the flash memory cell comprising the second oxide layer, the first in situ doped amorphous silicon layer, the dielectric layer, and the second doped amorphous silicon layer, and the select gate transistor comprising the first oxide layer, second oxide layer, the first in situ doped amorphous silicon layer, the dielectric layer, and the second doped amorphous silicon layer.

In another embodiment, the present invention relates to a method of forming a flash memory cell and a select gate transistor of a NAND type flash memory device, involving the steps of growing a first oxide layer having a thickness from about 130 Å to about 170 Å over at least a portion of a substrate, the substrate including a flash memory cell area and a select gate area; removing a portion of the first oxide layer in the flash memory cell area of the substrate; growing a second oxide layer over at least a portion of the substrate in the flash memory cell area and over at least a portion of the a first oxide layer in the select gate area; depositing a first in situ doped amorphous silicon layer over at least a portion of the second oxide layer, the first in situ doped amorphous silicon layer having a thickness from about 500 Å to about 950 Å; depositing a dielectric layer over at least a portion of the first in situ doped amorphous silicon layer; depositing a second doped amorphous silicon layer over at least a portion of the dielectric layer; depositing a tungsten silicide layer over the second phosphorus doped amorphous silicon layer using $SiH_2Cl_2$ and $WF_6$; and forming a flash memory cell in the flash memory cell area of the substrate and a select gate transistor in the select gate area substrate, the flash memory cell comprising the second oxide layer, the first in situ doped amorphous silicon layer, the dielectric layer, the second doped amorphous silicon layer, and the tungsten silicide layer, and the select gate transistor comprising the first oxide layer, second oxide layer, the first in situ doped amorphous silicon layer, the dielectric layer, the second doped amorphous silicon layer, and the tungsten silicide layer.

In yet another embodiment, the present invention relates to a method of forming a select gate transistor for a NAND type flash memory device, involving the steps of forming a first oxide layer having a thickness from about 130 Å to about 170 Å over at least a portion of a substrate; forming a second oxide layer over the first oxide layer to provide a gate oxide, the gate oxide having a thickness from about 150 Å to about 190 Å; and depositing an in situ doped amorphous silicon layer over the gate oxide at a temperature from about 450° C. to about 590° C. under a pressure from about 300 mTorr to about 700 mTorr, the in situ doped amorphous silicon layer having a thickness from about 400 Å to about 1,000 Å, and a dopant concentration from about $1\times10^{15}$ ions/cm$^3$ to about $2\times10^{20}$ ions/cm$^3$.

BRIEF DESCRIPTION OF DRAWINGS

FIG. 2a is a schematic diagram illustrating a core portion of a NAND-type flash memory device; and FIG. 2b is a plan layout view of the core portion of the NAND-type flash memory device of FIG. 2a.

DISCLOSURE OF THE INVENTION

Figure 1A:
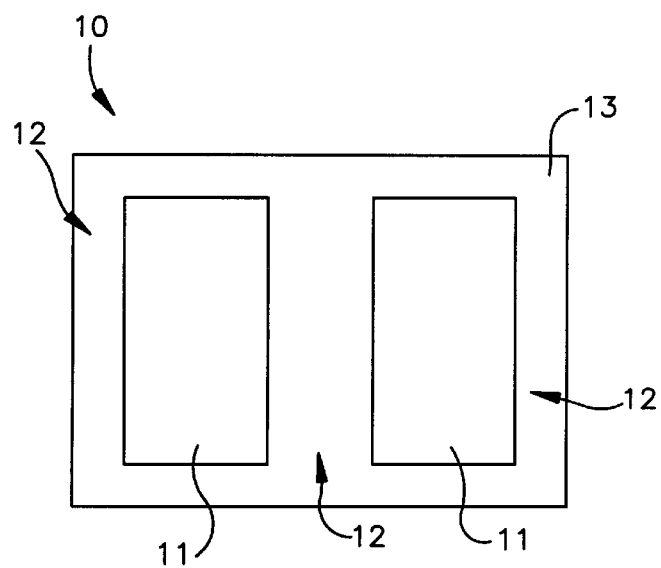
FIG. 1a is a plan view illustrating a prior art layout of a flash memory chip.
Figure 1B:
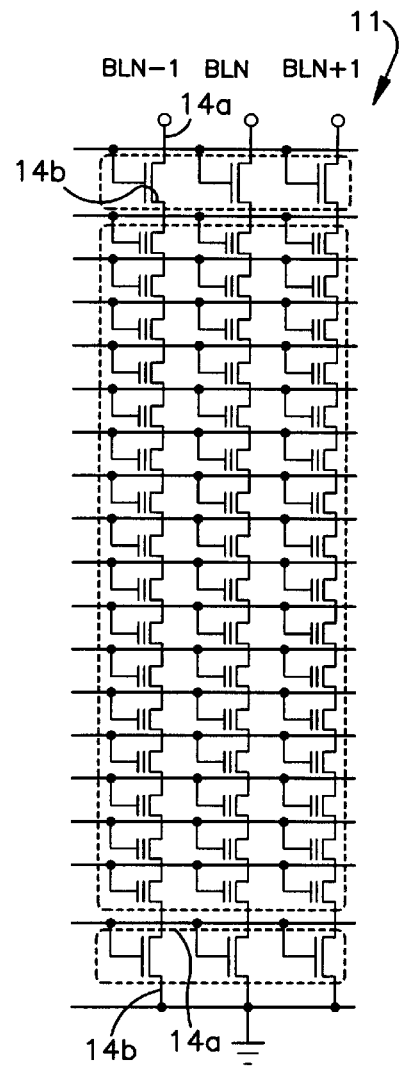
FIG. 1b is a schematic diagram illustrating a prior art NAND-type flash memory circuit configuration.
Figure 1C:
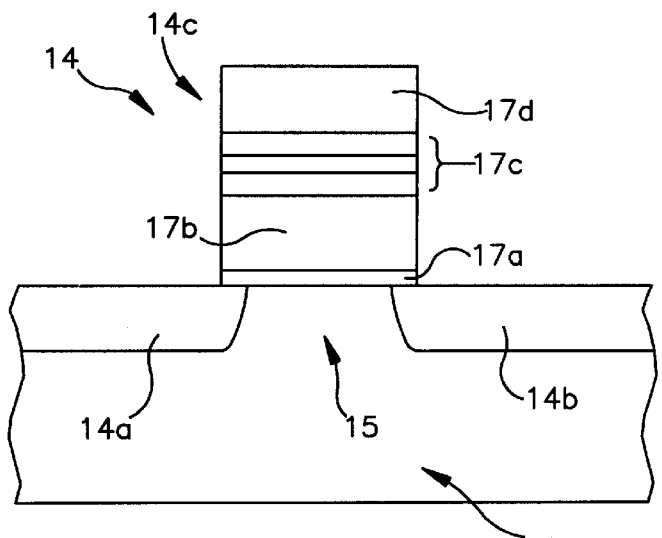
FIG. 1c is a fragmentary cross section illustrating a prior art stacked gate flash memory cell.

As a result of the present invention, non-volatile flash memory devices having improved reliability are obtainable. By employing the methods of the present invention, select gates are formed with improved reliability and performance. Moreover, the production of flash memory cells and select gates having a low defect density, minimized charge gain/loss concerns from high/low Poly 1 doping, and fewer select gate interconnection problems is facilitated.

The present invention is described with reference to the drawings wherein like reference numerals are used to refer to like elements throughout. The present invention relates to a flash memory device and a method for its manufacture that, according to one aspect of the present invention, eliminates the dual core oxide processing steps. Consequently, the steps used in forming the high and low voltage gate transistor structures of the periphery region may be used to construct the select gate transistors, thereby substantially reducing the number of processing steps needed to construct the flash memory device.

Figures 2A, 2B:
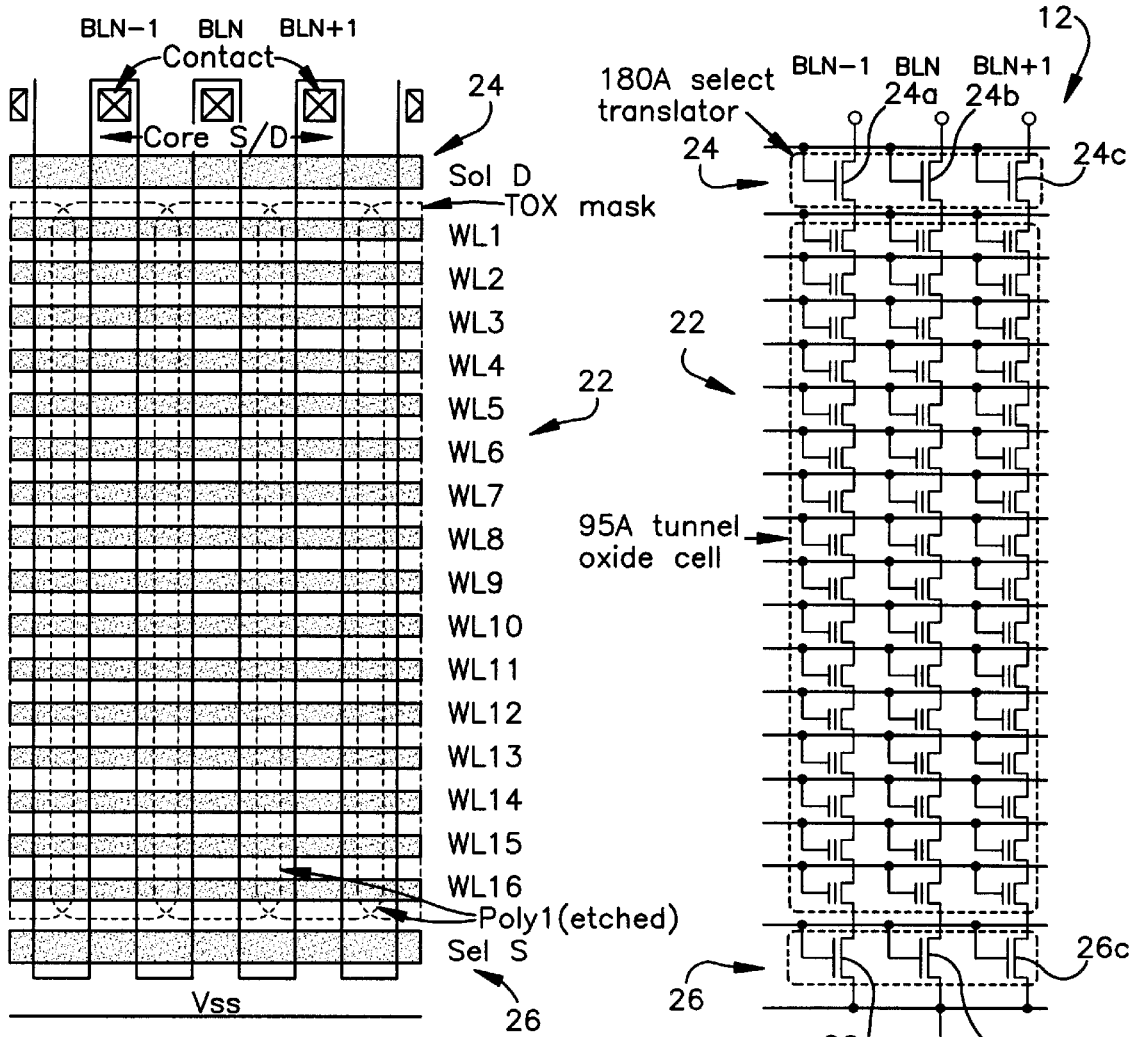

The present invention may be understood and its advantages appreciated in conjunction with the process of FIGS. 2–14. A circuit schematic diagram illustrating a core portion 11 of a NAND-type flash memory device is illustrated in FIG. 2a. The core portion 11 includes a memory cell region 22 which is bounded on one side by a drain select transistor portion 24 and bounded on another side by a source select transistor portion 26. Each of the select transistor portions 24 and 26 contain select gate transistors 24a–24c and 26a–26c, respectively, which operate to selectively activate a desired bit line (for example, BLN-1, BLN, BLN+1) by ensuring the selectivity of each bit line and preventing the cell current from conducting current through the bit line during a programming operation as is known by those skilled in the art.

In the NAND-type flash memory process which forms the core circuit 12 of FIG. 2a and its corresponding circuit layout (of which FIG. 2b is a plan view), an improved process is used to form the stacked memory cells and the select gate transistor.

The core select gate transistors 24a–24c and 26a–26c are somewhat similar in structure to the stacked gate flash memory structures in the memory cell region 22 except that their gate oxide is approximately twice as thick as the cell oxide (also called the tunnel oxide) in the stacked gate structure of the memory cell (about 170 Å compared to about 90 Å). The select transistors 24a–24c utilize a gate oxide of about 170 Å to improve the reliability of the transistors by reducing the vulnerability of the devices to band to band tunneling induced hot carrier stress during programming. The select gate transistors 24a–24c and 26a–26c further differ from the stacked gate flash memory cell structures of the region 22 because they operate as conventional MOS transistors and therefore have one doped amorphous silicon layer as a standard MOS transistor configuration. A plan circuit layout view of the conventional NAND-type circuit arrangement 12 is illustrated in FIG. 2b.

Prior to providing a specific example of the methods of the present invention, a general example is provided. A first gate oxide is grown using any suitable means, such as dry oxidation, wet oxidation or thermal oxidation, on at least a portion of a semiconductor substrate typically made of silicon. This process highlights the activity in the core region of the substrate, which is where the stacked memory cells and the select gate transistors are subsequently positioned. In this connection, the core region of the substrate contains two areas; namely, the stacked memory cell area and the select gate transistor area. The first gate oxide later serves as a portion of the select gate transistor oxide. In one embodiment, the first gate oxide has a thickness from about 70 Å to about 110 Å. In another embodiment, the first gate oxide has a thickness from about 80 Å to about 100 Å.

A mask is then provided over the select gate transistor area of the core region, leaving exposed the first gate oxide in the stacked memory cell area. The first gate oxide in the stacked memory cell area is etched using a suitable etching procedure, which may optionally include corresponding cleaning step(s). In a preferred embodiment, a buffered oxide etch process is employed to remove the first gate oxide in the stacked memory cell area. The mask is then removed.

The structure is then subject to another oxidation process to provide a second oxide layer. In particular, a second oxide layer is provided in the stacked memory cell area while the thickness of the first oxide layer in the select gate transistor area is increased. Oxidation is performed using any suitable means, such as dry oxidation, wet oxidation or thermal oxidation. The increased oxide layer in select gate transistor area later serves as the select gate transistor oxide. The second oxide layer in the stacked memory cell area later serves as the tunnel oxide. In one embodiment, the increased gate oxide in select gate transistor area has a thickness from about 150 Å to about 190 Å while the second oxide in the stacked memory cell area has a thickness from about 70 Å to about 110 Å. In another embodiment, the increased gate oxide in select gate transistor area has a thickness from about 160 Å to about 180 Å while the second oxide in the stacked memory cell area has a thickness from about 80 Å to about 100 Å.

Next, a relatively thin first doped amorphous silicon layer is provided over at least a portion of the increased and second gate oxides (over the select gate transistor area and stacked memory cell area). The first doped amorphous silicon layer later serves as the floating gate of the stacked memory cell (also termed Poly 1) and the gate of the select gate transistor. The thin first doped amorphous silicon layer is made using a specifically defined and controlled in situ doping process employing relatively low temperatures and specific doping conditions.

The temperature at which the thin first doped amorphous silicon layer is made is from about 450° C. to about 590° C. In another embodiment, the temperature is from about 490° C. to about 560° C. In yet another embodiment, the temperature is from about 510° C. to about 550° C. The pressure at which the thin first doped amorphous silicon layer is made is from about 300 mTorr to about 700 mTorr. In another embodiment, the pressure is from about 350 mTorr to about 600 mTorr.

The dopant employed to make the thin first doped amorphous silicon layer is at least one of phosphorus and arsenic. In a preferred embodiment, the dopant is phosphorus. The dopant concentration in the resultant first doped amorphous silicon layer is from about $1\times10^{15}$ ions/cm$^3$ to about $2\times10^{20}$ ions/cm$^3$. In another embodiment, the dopant concentration is from about $1\times10^{16}$ ions/cm$^3$ to about $1\times10^{20}$ ions/cm$^3$. In yet another embodiment, the dopant concentration is from about $1\times10^{17}$ ions/cm$^3$ to about $5\times10^{19}$ ions/cm$^3$. When the dopant concentration is above about $1\times10^{20}$ ions/cm$^3$, the interfacial surface between the tunnel oxide and the first doped amorphous silicon layer (floating gate) is too rough. When the dopant concentration is below about $1\times10^{15}$ ions/cm$^3$, the wordline resistance and contact resistance are undesirably high.

In one embodiment, the resultant first doped amorphous silicon layer has a thickness from about 400 Å to about 1,000 Å, and preferably from about 500 Å to about 950 Å. In another embodiment, the resultant first doped amorphous silicon layer has a thickness from about 600 Å to about 900 Å. When the resultant first doped amorphous silicon layer has a thickness above about 1,000 Å, undesirable cracking of the subsequently applied tungsten silicide layer occurs, as well as etch problems due to high aspect ratios and high topographies. When the resultant first doped amorphous silicon layer has a thickness below about 400 Å, undesirable pinhole defects and Poly 1 contact punch through occur.

A dielectric layer is provided using any suitable means over at least a portion of the first doped amorphous silicon layer. The dielectric layer preferably contains three layers; namely two oxide layers sandwiching a nitride layer (a so-called ONO layer). The dielectric layer later serves as the interpoly dielectric layer of the stacked memory cell. In one embodiment, the dielectric layer has a thickness from about 100 Å to about 160 Å, and preferably from about 120 Å to about 140 Å.

A second doped amorphous silicon layer is provided using any suitable means over at least a portion of the substrate. The second doped amorphous silicon layer later serves as the control gate of the stacked memory cell (also termed Poly 2). In one embodiment, the second doped amorphous silicon layer has a thickness from about 1,000 Å to about 1,400 Å, and preferably from about 1,100 Å to about 1,300 Å.

A tungsten silicide layer is next provided over at least a portion of the second doped amorphous silicon layer. The tungsten silicide layer may be formed by suitable means, such as via CVD techniques using a gas flow including either SiH$_2$Cl$_2$ and WF$_6$ or SiH$_4$ and WF$_6$. The gas flow may further contain an inert gas, such as a noble gas (He, Ne, Ar, Kr and Xe). In a preferred embodiment, the tungsten silicide layer is provided using SiH$_2$Cl$_2$ and WF$_6$ with an inert gas. After the tungsten silicide deposition, an optional rapid thermal anneal (RTA) is performed in a nitrogen atmosphere. In one embodiment, the tungsten silicide layer has a thickness from about 1,000 Å to about 1,800 Å. In another embodiment, the tungsten silicide layer has a thickness from about 1,200 Å to about 1,600 Å. In yet another embodiment, the tungsten silicide layer has a thickness from about 1,300 Å to about 1,500 Å.

Depositing the tungsten silicide layer is conducted at a temperature from about 450° C. to about 650° C. and a pressure from about 70 Pa to about 120 Pa. In a preferred embodiment, the temperature is from about 500° C. to about 600° C. and the pressure is from about 80 Pa to about 110 Pa. In one embodiment, the gas flow contains from about 50 standard cubic centimeters per minute (sccm) to about 250 sccm $SiH_2Cl_2$ and from about 2 sccm to about 10 sccm $WF_6$. In embodiments where an inert gas is employed, the gas flow further contains from about 100 sccm to about 250 sccm of an inert gas.

The tungsten silicide deposition according to the present invention forms a tungsten silicide layer having a low or no occurrence of microcracking. As a result, the tungsten silicide layer made in accordance with the present invention has low resistance compared to tungsten silicide layers made using silane.

After the tungsten silicide deposition, an optional anneal step is performed. Although not required, annealing the tungsten silicide layer can, in some instances, further contribute to the ability of the tungsten silicide layer to resist microcracking. In a preferred embodiment, a rapid thermal anneal (RTA) is performed. Annealing of the tungsten silicide layer is preferably conducted in an ambient atmosphere, such as a nitrogen ($N_2$) atmosphere. In one embodiment, annealing is conducted at a temperature from about 850° C. to about 950° C. In one embodiment, annealing is conducted for a time from about 10 seconds to about 30 seconds. The annealing primarily serves to further decrease the occurrence of microcracking in the tungsten silicide layer.

Additional layers are provided using any suitable means over portions of the second doped amorphous silicon layer. For example, a silicon oxynitride layer may be provided over the tungsten silicide layer.

A series of mask and etch steps (such as self aligned etch steps) are employed to form stacked flash memory cells, select gate transistors, word lines, interconnections, and the like. These steps are known in the art. The NAND-type process involves the fabrication of at least two types of devices; namely a stacked gate memory cell and a select gate transistor in the core region of the flash memory device.

As a result of the present invention, and in particular the conditions for forming the first doped silicon layer and the tungsten silicide layer, a high quality flash memory device is produced. The conditions for forming the first doped silicon layer lead to high quality floating gates in the flash memory cells and high quality gates in the select gate transistors.

Figure 3:
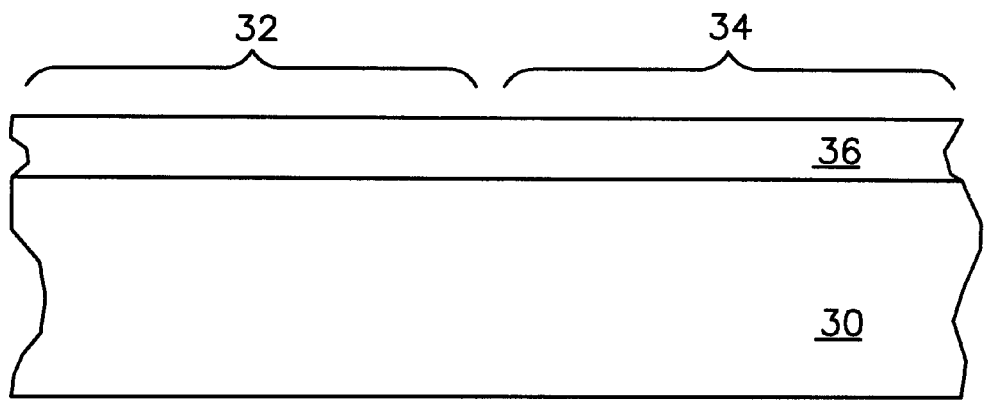
FIG. 3 is a cross sectional illustration of one aspect of a method of making a NAND type flash memory device in accordance with the present invention.

A semiconductor manufacturing process flow illustrating the NAND-type flash memory device process is described in greater detail in conjunction with FIGS. 3–13. Referring to FIG. 3, a substrate 30 is provided. The substrate 30 is typically a silicon substrate optionally with various elements, regions and/or layers thereover; including metal layers, barrier layers, dielectric layers, device structures, active regions such as active silicon regions or areas, active elements and passive elements including P wells, N wells, additional polysilicon gates, wordlines, source regions, drain regions, bit lines, bases, emitters, collectors, conductive lines, conductive plugs, etc. The substrate 30 has two main areas; namely, a select gate transistor area 32 and a stacked memory cell area 34. A first oxide layer 36 is provided over at least a portion of the substrate 30 or over the entire substrate 30. The first oxide layer 36, which subsequently forms a portion of the select gate transistor oxide (see FIG. 8) has a thickness of about 148 Å. The first oxide layer 36 in this embodiment is formed or grown by a dry oxidation process at about 900° C. under 13.5 l of oxygen, 462 cc HCl, and 14 l of argon. The dry oxidation process may be followed by an annealing step at about 900° C. under argon.

Figure 4:
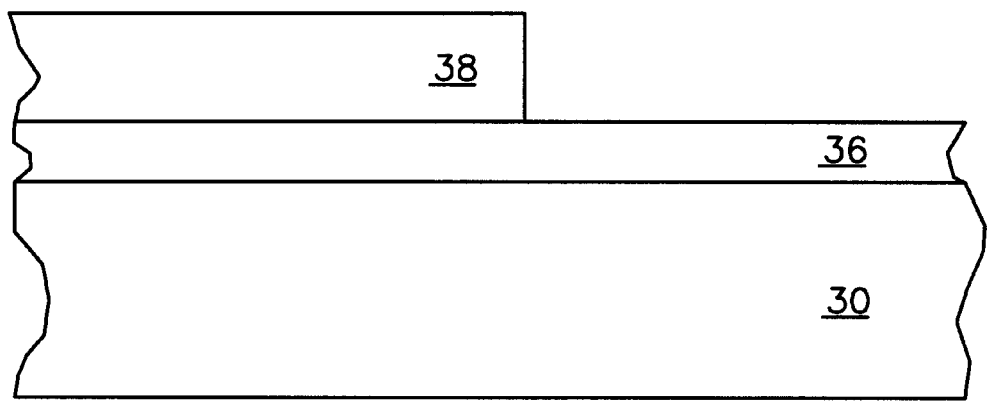
FIG. 4 is a cross sectional illustration of one aspect of a method of making a NAND type flash memory device in accordance with the present invention.

Referring to FIG. 4, a mask 38 is used to cover the select gate transistor areas 32 of the substrate 30 leaving the first oxide layer 36 in the stacked memory cell area 34 exposed. The mask 38 contains a suitable photoresist material and is formed using suitable photolithographic techniques including spin on deposition, selective irradiation, and development.

Figure 5:
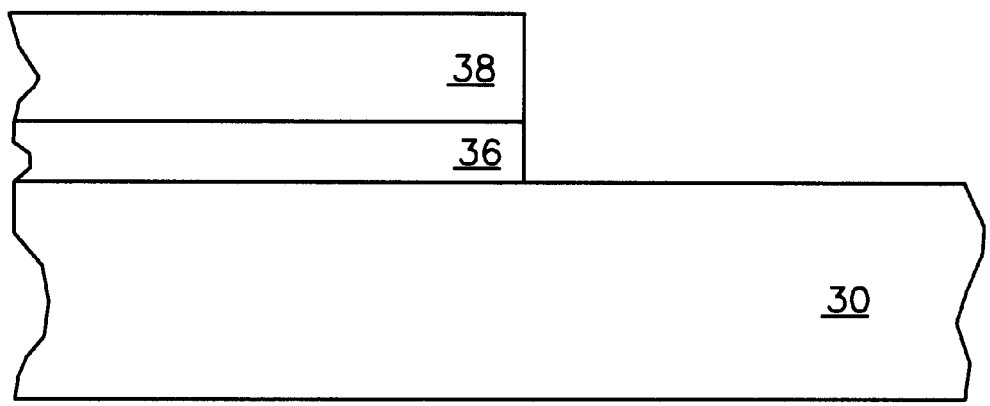
FIG. 5 is a cross sectional illustration of one aspect of a method of making a NAND type flash memory device in accordance with the present invention.

Referring to FIG. 5, the exposed portion of the structure (the stacked memory cell area 34) is etched down to the substrate 30. Specifically, the exposed portions of the first oxide layer 36 are removed exposing the substrate 30 in the stacked memory cell area 34 using suitable etching techniques.

Figure 6:
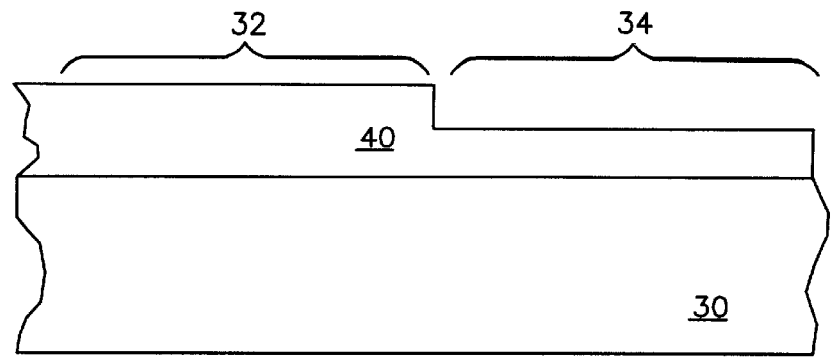
FIG. 6 is a cross sectional illustration of one aspect of a method of making a NAND type flash memory device in accordance with the present invention.

Referring to FIG. 6, the mask 38 is removed and a second oxide layer 40 is provided on at least a portion of the exposed portions of the substrate 30 (over the stacked memory cell area 34 and the select gate area 32). In this embodiment, the second oxide layer 40 is formed by dry oxidation at about 1050° C. under 1.33 l oxygen, 12.6 l of argon, and 70 cc of HCl. The second oxide layer 40 subsequently forms the tunnel oxide for the stacked memory cell and combines with the first oxide layer to subsequently form the gate oxide for the select gate transistor (see FIG. 8). The second oxide layer 40 has a thickness of about 87 Å in the stacked memory cell area 34 and about 168Å in the select gate transistor area 34. In the select gate transistor area 34, the second oxide layer 40 shown is a combination of the first oxide layer 36 and the second oxide 40, and thus is simply represented as a thicker portion of the second oxide layer 40 as compared to the thinner portion of the second oxide layer 40 in the stacked memory cell area 34.

Figure 7:
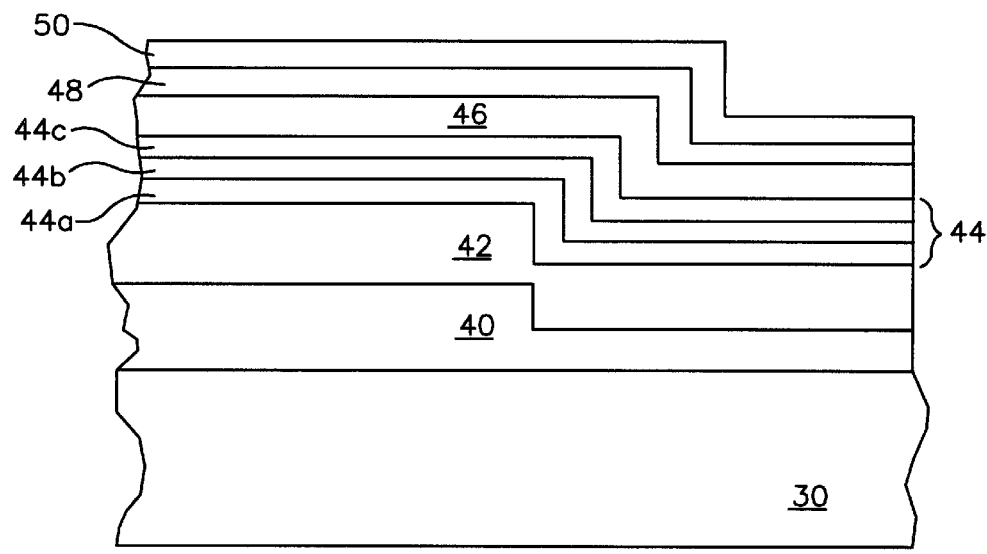
FIG. 7 is a cross sectional illustration of one aspect of a method of making a NAND type flash memory device in accordance with the present invention.

Referring to FIG. 7, a first doped amorphous silicon layer 42 is provided using an in situ doping process over at least a portion of the second oxide layer 40 (over the stacked memory cell area 34 and the select gate area 32). In this embodiment, a phosphorus doped amorphous silicon layer is deposited via CVD to form a doped amorphous silicon layer 38 at 530° C., 400 mTorr, $SiH_4$ at 2000 sccm, and a mixture of 1% by weight $PH_3$ in helium at about 22 sccm. The first doped amorphous silicon layer 42 (also termed Poly 1) subsequently forms the floating gate (see FIG. 8) of the stacked memory cell and the gate of the select gate transistor. The first doped amorphous silicon layer 42 has a thickness of about 900 Å.

A dielectric layer 44 is provided over at least a portion of the first doped amorphous silicon layer 42 (over the stacked memory cell area 34 and the select gate area 32). The dielectric layer 44 is an ONO multilayer dielectric containing three layers; namely an oxide layer 44a, a nitride layer 44b, and another oxide layer 44c. The dielectric layer subsequently forms the interpoly dielectric layer (see FIG. 8) of the stacked memory cell. The dielectric layer has a thickness of about 130 Å. Oxide layer 44a is deposited at a temperature of about 750° C. under $SiH_4$ at 20 cc, $N_2O$ at 1.2 l and a pressure of 600 mTorr via low pressure CVD (LPCVD) on the first doped amorphous silicon layer 42. Nitride is next deposited at a temperature of about 760° C. under $NH_3$ at 600 cc, $SiH_2Cl_2$ at 100 cc and a pressure of 330 mTorr to form a nitride layer 40b. The nitride layer 44b is oxidized with wet oxygen at a temperature of about 950° C. under $O_2$ at 5 l and $H_2$ at 9 l for 40 minutes to form another oxide layer 44c.

A second doped amorphous silicon layer 46 is provided over at least a portion of the substrate (over the stacked memory cell area 34 and the select gate area 32). In this embodiment, the phosphorus doped amorphous silicon layer is deposited via LPCVD to form a doped amorphous silicon layer 46 at 530° C., 400 mTorr, SiH$_4$ at 2000 sccm, and a mixture of 1% by weight PH$_3$ in helium at about 22 sccm. The second doped amorphous silicon layer 46 has a thickness of about 1,200 Å. The second doped amorphous silicon layer 46 subsequently forms the control gate of the stacked memory cell (also termed Poly 2).

A tungsten silicide layer 48 is provided over at least a portion of the second doped amorphous silicon layer 46 (over the stacked memory cell area 34 and the select gate area 32). The tungsten silicide layer 46 may be formed by suitable means. In this embodiment, the tungsten silicide is deposited via CVD techniques at a temperature of about 565° C. and a pressure of about 93 Pa. The gas flow includes SiH$_2$Cl$_2$ and WF$_6$. The gas flow may further contain an inert gas, such as Ar. After the tungsten silicide deposition, an RTA is performed in a nitrogen atmosphere. The tungsten silicide layer 48 has a thickness of about 1,400 Å.

A silicon oxynitride layer 50 is provided over at least a portion of the tungsten silicide layer 48 (over the stacked memory cell area 34 and the select gate area 32). The silicon oxynitride layer 50 is formed via suitable techniques including via physical vapor deposition (PVD) techniques. Methods of forming silicon oxynitride are known in the art. The silicon oxynitride layer 50 has a thickness from about 800 Å to about 1,200 Å, but in this embodiment, the thickness is about 1,000 Å.

Figure 8:
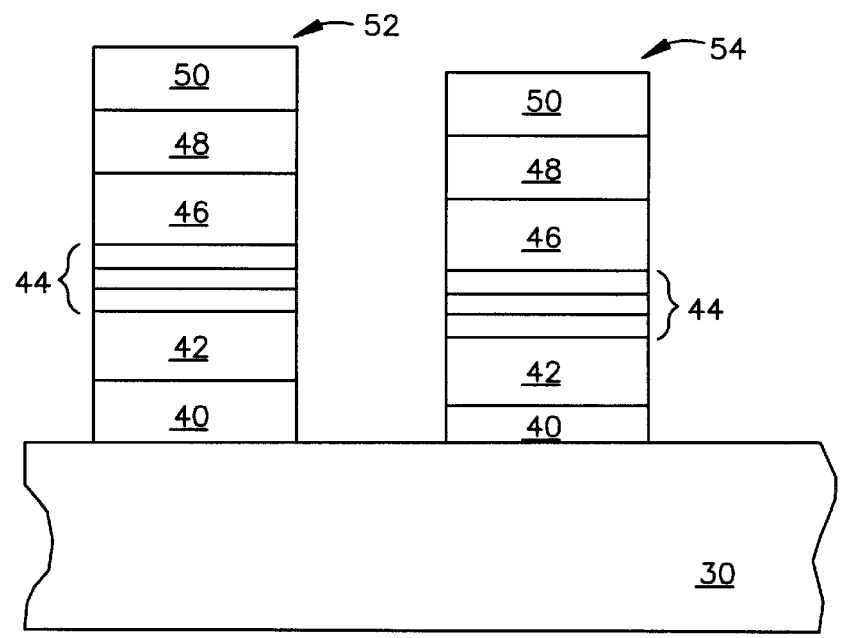
FIG. 8 is a cross sectional illustration of a NAND type flash memory device in accordance with the present invention.

Referring to FIG. 8, a series of masks and etch steps are employed to form various structures including a select gate transistor 52 and a stacked flash memory cell 54. Although not shown, various contacts and interconnects may be formed, as well as the deposition of an encapsulating oxide film, such as tetraethylorthosilicate (TEOS), borophosphotetraethylorthosilicate (BPTEOS), phosphosilicate glass (PSG), or borophosphosilicate glass (BPSG). The illustration of FIG. 8 is shown along a bit line.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a NAND type flash memory device, comprising:

growing a first oxide layer over at least a portion of a substrate, the substrate including a flash memory cell area and a select gate area;

removing a portion of the first oxide layer in the flash memory cell area of the substrate;

growing a second oxide layer over at least a portion of the substrate in the flash memory cell area and over at least a portion of the a first oxide layer in the select gate area;

depositing a first in situ doped amorphous silicon layer over at least a portion of the second oxide layer, the first in situ doped amorphous silicon layer having a thickness from about 400 Å to about 1,000 Å;

depositing a dielectric layer over at least a portion of the first in situ doped amorphous silicon layer;

depositing a second doped amorphous silicon layer over at least a portion of the dielectric layer; and forming a flash memory cell in the flash memory cell area of the substrate and a select gate transistor in the select gate area substrate, the flash memory cell comprising the second oxide layer, the first in situ doped amorphous silicon layer, the dielectric layer, and the second doped amorphous silicon layer, and the select gate transistor comprising the first oxide layer, second oxide layer, the first in situ doped amorphous silicon layer, the dielectric layer, and the second doped amorphous silicon layer.

2. The method of claim 1, wherein the first oxide layer has a thickness from about 130 Å to about 170 Å.

3. The method of claim 1, wherein the first in situ doped amorphous silicon layer comprises a phosphorus in situ doped amorphous silicon layer.

4. The method of claim 1, wherein the first doped amorphous silicon layer has a thickness from about 600 Å to about 900 Å.

5. The method of claim 1, wherein the dielectric layer comprises a first oxide layer, a nitride layer over the first oxide layer, and a second oxide layer over the nitride layer.

6. The method of claim 1, wherein the second oxide layer in the flash memory cell area has a thickness from about 70 Å to about 110 Å.

7. The method of claim 1, wherein the first and second oxide layers have a combined thickness from about 150 Å to about 190 Å.

8. The method of claim 1, wherein the second doped amorphous silicon layer comprises a phosphorus in situ doped amorphous silicon layer having a thickness from about 1,000 Å to about 1,400 Å.

9. A method of forming a flash memory cell and a select gate transistor of a NAND type flash memory device, comprising:

growing a first oxide layer having a thickness from about 130 Å to about 170 Å over at least a portion of a substrate, the substrate including a flash memory cell area and a select gate area;

removing a portion of the first oxide layer in the flash memory cell area of the substrate;

growing a second oxide layer over at least a portion of the substrate in the flash memory cell area and over at least a portion of the first oxide layer in the select gate area;

depositing a first in situ doped amorphous silicon layer over at least a portion of the second oxide layer, the first doped amorphous silicon layer having a thickness from about 500 Å to about 950 Å;

depositing a dielectric layer over at least a portion of the first in situ doped amorphous silicon layer;

depositing a second doped amorphous silicon layer over at least a portion of the dielectric layer;

depositing a tungsten silicide layer over the second doped amorphous silicon layer using SiH$_2$Cl$_2$ and WF$_6$; and forming a flash memory cell in the flash memory cell area of the substrate and a select gate transistor in the select gate area substrate, the flash memory cell comprising the second oxide layer, the first in situ doped amorphous silicon layer, the dielectric layer, the second doped amorphous silicon layer, and the tungsten silicide layer, and the select gate transistor comprising the first oxide layer, the second oxide layer, the first in situ doped amorphous silicon layer, the dielectric layer, the second doped amorphous silicon layer, and the tungsten silicide layer.

10. The method of claim 9, wherein the first in situ doped amorphous silicon layer is deposited at a temperature from about 490° C. to about and a pressure from about 350 mTorr to about 600 mTorr.

11. The method of claim 9, wherein the first in situ doped amorphous silicon layer comprises at least one of phosphorus and arsenic.

12. The method of claim 9, wherein the first in situ doped amorphous silicon layer has a dopant concentration from about $1\times10^{16}$ ions/cm$^3$ to about $1\times10^{20}$ ions/cm$^3$.

13. The method of claim 9, wherein the dielectric layer has a thickness from about 110 Å to about 150 Å and comprises a first oxide layer, a nitride layer over the first oxide layer, and a second oxide layer over the nitride layer.

14. The method of claim 9, wherein the tungsten silicide layer is deposited at a temperature from about 450° C. to about 650° C. and a pressure from about 70 Pa to about 120 Pa.

15. The method of claim 9, wherein the tungsten silicide layer is deposited using a gas flow comprising from about 50 sccm to about 250 sccm SiH$_2$Cl$_2$ and from about 2 sccm to about 10 sccm WF$_6$ and optionally from about 100 sccm to about 250 sccm of an inert gas.

16. A method of forming a select gate transistor for a NAND type flash memory device, comprising:

forming a first oxide layer having a thickness from about 130 Å to about 170 Å over at least a portion of a substrate;

forming a second oxide layer over the first oxide layer to provide a gate oxide, the gate oxide having a thickness from about 150 Å to about 190 Å; and depositing an in situ doped amorphous silicon layer over the gate oxide at a temperature from about 450° C. to about 590° C. under a pressure from about 300 mTorr to about 700 mTorr, the in situ doped amorphous silicon layer having a thickness from about 400 Å to about 1,000 Å, and a dopant concentration from about $1\times10^{15}$ ions/cm$^3$ to about $2\times10^{20}$ ions/cm$^3$.

17. The method of claim 16, wherein the first oxide layer is formed using a dry oxidation process.

18. The method of claim 16, wherein the gate oxide has a thickness from about 160 Å to about 180 Å.

19. The method of claim 16, wherein the in situ doped amorphous silicon layer having a thickness from about 600 Å to about 900 Å.

20. The method of claim 16, wherein the in situ doped amorphous silicon layer has a phosphorus dopant concentration is from about $1\times10^{17}$ ions/cm$^3$ to about $5\times10^{19}$ ions/cm$^3$.

* * * * *